United States Patent [19]
Tate

[11] Patent Number: 4,967,388
[45] Date of Patent: Oct. 30, 1990

[54] TRUNCATED PRODUCT PARTIAL CANONICAL SIGNED DIGIT MULTIPLIER

[75] Inventor: Larry R. Tate, Flemington, N.J. 08822

[73] Assignee: Harris Semiconductor Patents Inc., Melbourne, Fla.

[21] Appl. No.: 178,982

[22] Filed: Apr. 21, 1988

[51] Int. Cl.$^5$ .............................................. G06F 7/52
[52] U.S. Cl. .................................................... 364/760
[58] Field of Search ................................ 364/760, 745

[56] References Cited

U.S. PATENT DOCUMENTS

| | | | |
|---|---|---|---|
| 3,691,359 | 9/1972 | Dell et al. | 364/760 |
| 3,919,535 | 11/1975 | Vattuone | 364/760 |
| 4,122,527 | 10/1978 | Swiatowiec | 364/760 |
| 4,597,053 | 6/1986 | Chamberlin | 364/760 |

OTHER PUBLICATIONS

Blaauw et al., "Binary Multiplication" *IBM Tech. Disclosure Bulletin* vol. 4, No. 11, Apr. 1962, pp. 32-34.

*Primary Examiner*—David H. Malzahn
*Attorney, Agent, or Firm*—Henry I. Schanzer; W. J. Shanley; Kenneth R. Glick

[57] ABSTRACT

A truncated product partial canonical signed digit (PCSD) multiplier is disclosed for use in a finite impulse response (FIR) digital filter. Each multiplier quantity is coded as two non-zero signed digits in an 8-bit word. Each non-zero signed digit is recoded into a four bit nibble for application to the multiplier. Each partial product output of the multiplier is truncated from 16 to 11 bits. The multiplier operations are performed in the sequence shift right, truncate, one's complement, add partial products and, according to the output of a logic control circuit, add one into an appropriate order.

10 Claims, 5 Drawing Sheets

| I | 1 | 2 | 4 | CIN |
|---|---|---|---|---|
| 0 | X | X | X | 0 |
| 1 | X | X | 0 | 1 |
| 1 | 0 | 0 | 1 | M0B |
| 1 | 1 | 0 | 1 | M0B*M1B |
| 1 | 0 | 1 | 1 | M0B*M1B*M2B |
| 1 | 1 | 1 | 1 | M0B*M1B*M2B*M3B |

FIG. 6

TRUNCATED PRODUCT PARTIAL CANONICAL SIGNED DIGIT MULTIPLIER

BACKGROUND OF THE INVENTION

This invention relates to binary multiplier systems and, in particular to such multiplier systems which are adapted for use in a Finite Impulse Response (FIR) digital filter arrangement.

In U.S. Pat. No. 4,486,851, entitled "Incrementing-/Decrementing Circuit for a FIR Filter" and in U.S. Pat. No. 4,507,725, entitled "Digital Filter Overflow Sensor", each of which patents were granted to L. A. Christopher and D. L. Sprague, a finite impulse response filter is described. Additional details of such an arrangement are also provided in the 1982 Master's Thesis submitted by Christopher to MIT (Massachusetts Institute of Technology) entitled "A Versatile FIR Filter for Use in the Video Processing Section of a Digital Television Receiver". In the Christopher and Sprague FIR filter arrangement, a plurality of specifically delayed signal samples are multiplied by predetermined coefficients and the resulting products are summed to provide the desired filter characteristic. The multiplication and summing functions are performed in that FIR filter making use of shift matrix and adder circuits designed to function with two's complement arithmetic. Christopher and Sprague recognized that simplification of the arithmetic operations is particularly desirable in an FIR filter in order to minimize circuit complexity and to maximize computational speed. To that end, Christopher and Sprague employed arrangements for truncating the partial product outputs of their multiplier circuits to eleven bits where eight bit multiplicand and canonical signed digit (CSD) multiplier quantities were employed. Furthermore in performing two's complement multiplication, Christopher and Sprague only simulated or approximated the steps required to convert the truncated partial products to two's complement form. Christopher et al supplied sign information of the multiplier quantity as a carry input for the least significant bit of the adder of each multiplier stage. In practice, it has been found to be necessary to produce a two's complement partial product in a more accurate manner in the course of digital computation of signal values while, at the same time, avoiding the introduction of unduly complex signal processing circuits. It has been found that the operations of truncation and two's complementing are non-commutative and therefore special steps must be taken depending on the order of performing operations in order to insure an accurate result. It should also be noted that Christopher et al proposed arrangements for sensing and utilizing "carry" signals occurring at the outputs of the various stages of the multiplier (adders) to control system signal gain and thereby prevent data "overflow". Specifically, the carry bits from a plurality of multiplier stages were summed by Christopher and Sprague in a common circuit and the resulting sum was taken to be indicative of "overflow" of the capacity of the arithmetic circuits. It was proposed by Christopher and Sprague that the gain of analog signal amplifier(s) preceding the FIR filter input be adjusted in response to the carry information to reduce the occurrence of such "overflow" conditions. The presence of that gain control capability has not been found to be required in an FIR filter in the general case.

THE INVENTION

Specifically in connection with the design of such a Finite Impulse Response (FIR) Filter chip, the need for a novel multiplier arose which has significant advantages in terms of reduced area and increased speed over previous designs. The novel multiplier embodying the invention is a Truncated Product Partial Canonical Signed Digit Multiplier (hereafter also sometimes referred to as PCSD). Canonical signed digit (CSD) multipliers are known in the art (see, for example, L. Schmidt, "Designing Programmable Digital Filters for LSI Implementation" Hewlett-Packard Journal; September, 1978, PP 15–23). As noted above, Christopher et al described an approximation to a PCSD multiplier. Applicants and Christopher et al each recognized that a partial CSD multiplier, in which only two partial products are generated internally, is sufficient for the 8-bit multipliers used in a wide range of applications of video rate FIR filters. By limiting the partial products to two, and by implementing the carry function in accordance with the invention, saves hardware and allows higher order filters to be implemented as a single chip than would otherwise be possible. In most video applications only a limited number of product bits are needed from a systems design standpoint. For example, for an 8-bit input and output filter system, an internal precision of 11-bits insures that the 8-bit output is sufficiently accurate for many practical applications. Consequently, in the CSD multiplier design the product is truncated from 16 to 11 bits while maintaining consistent two's complement arithmetic. The PCSD embodying the invention, when compared to a full multiplier, may be fabricated in one third the area and is typically faster by a factor of fifty percent. Arranging the operations needed in a CSD multiplier according to this invention, as will appear below, i.e., shiftright and truncate, one's complement, add partial products, and add one, when appropriate, into the order listed, one achieves the additional benefit that the most negative two's complement number to be handled is handled correctly without the need for the added circuitry to handle an extra overflow bit:—that is, multiplier values of $-128_{10}$ to $+127_{10}$ may be represented as 8-bit two's complement numbers. In the arrangement described below, numerical values are scaled by dividing by $128_{10}$ to create binary fractions appropriate to prevent overflow in the associated FIR filter. The two's complement of $-128_{10}$ would require a nine bit two's complement representation to prevent overflow, but it's one's complement of $-128_{10}$ requires only eight bits. In accordance with the present invention, one's complements of numerical values are formed and thereafter, two's complement representations are formed by adding one (when needed) at the time that two partial products are summed, thus avoiding the need for an overflow (ninth) bit while still allowing internal partial products to be formed with a multiplier of $-1_{10}$ (that is $-128_{10}$ scaled by dividing by $128_{10}$). Product truncation has been accomplished in this design in an efficient and unique manner.

CSD MULTIPLIERS

Binary multiplication usually involves shifting and adding in one form or another and this holds for the CSD approach. The coding of the multiplier required by CSD is similar to Booth recoding: that is, signed digits, sometimes referred to hereafter as trits, are used instead of bits, where trits are defined to be digits which may assume the value of zero (0), one (1), or minus one (−1). Thus the 8-bit two's complement number 00111111 could be recoded as 0100000T, where T is used to represent a (−1) trit in the written notation.

The coding technique related to Booth's algorithm (canonical signed digit) is used to simplify the multiplication process—this technique yields very compact and very fast multiplier circuits. The term partial canonical signed digit (PCSD) herein refers to CSD multipliers with only two internal truncated partial products.

The PCSD multiplier quantity is coded as two non-zero signed digits (or Booth recoded bits). For example the decimal number 15 is represented in binary as 0001111 and it is represented in CSD as 001000T. Notice that the straight binary representation requires four non-zero binary bits while the CSD coefficient requires only two non-zero signed digits. In PCSD all multipliers are represented using two non-zero signed digits. In this way, only two partial product computations need be performed (one for each non-zero signed digit) and thereafter the partial products may be summed in a straightforward full adder along with one "carry" signal produced in accordance with this invention to produce a partial product which, after summing with a second "carry" signal, results in the desired product. As was the case in the Christopher configuration, in a partial canonical signed digit multiplier embodying this invention, an 8-bit multiplier control word is divided into two nibbles, where each "nibble" includes 4 bits and each nibble implements a non-zero signed digit. One bit (e.g., the most significant bit) (msb) of each nibble specifies whether or not to form the two's complement of an incoming multiplicand (i.e., that bit indicates the "sign" of the nibble); the second most significant bit is an instruction to shift right by one (i.e., multiply by ½); the third msb is a shift right by two instruction (i.e., multiply by ¼); and the lsb of the nibble is a shift right by four (i.e., multiply by 1/16) instruction.

In the Christopher et al configuration, the maximum shift right instruction was limited to a shift right by six. The multiplier nibble having one's in each of the three least significant bit positions was coded to represent a zero value multiplier by Christopher et al. In the case of the present invention, a shift right by seven has been implemented as well. Thus, for example, an eight bit recoded multiplier 0001000T. would be coded as 01101111. In the four least significant bits (right end), the first one signifies a negative sign while the three additional one's indicate a shiftright by seven (one plus two plus four) or a multiply by 1/128.

In order to simplify and further improve the performance of FIR digital filters as compared to the prior arrangements of this type, in accordance with the present invention in a digital filter for producing filtered output signals by combining weighted time sequential samples of a digital input data signal, a multiplier circuit comprises a first shift matrix having a data signal input for receiving an N-bit two's complement multiplicand signal which is to be weighted, a control signal input for receiving a first signed multiplier signal, and a partial product output for providing a one's complement form of the multiplicand signal shifted by a first predetermined number of bit positions determined by the value of the multiplier, the partial product being truncated to a number of bits less than 2N−1. The multiplier further comprises a second shift matrix having a data signal input for receiving an N-bit two's complement multiplicand signal which is to be weighted, a control signal input for receiving a second signed multiplier signal, and a partial product output for providing a one's complement form of the multiplicand signal shifted by a second predetermined number of bit positions determined by the value of the second multiplier signal, the partial product output being truncated to a number of bits which is less than 2N−1. The multiplier further comprises logic means associated with each of the shift matrices for evaluating the bits truncated from each of the partial product outputs as a function of the magnitude and sign of associated multiplier bits to provide first and second carry signal outputs suited for forming two's complement forms of the partial products. A first adder is provided having a first addend input coupled to the truncated one's complement partial product output of the first shift matrix, a second addend input coupled to the truncated one's complement partial product output of the second shift matrix, a carry input coupled to the first carry signal output and an output at which a weighted product signal is provided which, when combined with the second carry signal output comprises a two's complement product signal.

THE DRAWINGS

FIG. 6 is a truth table for the carry control logic circuit of FIG. 4.

DETAILED DESCRIPTION

Figure 1:
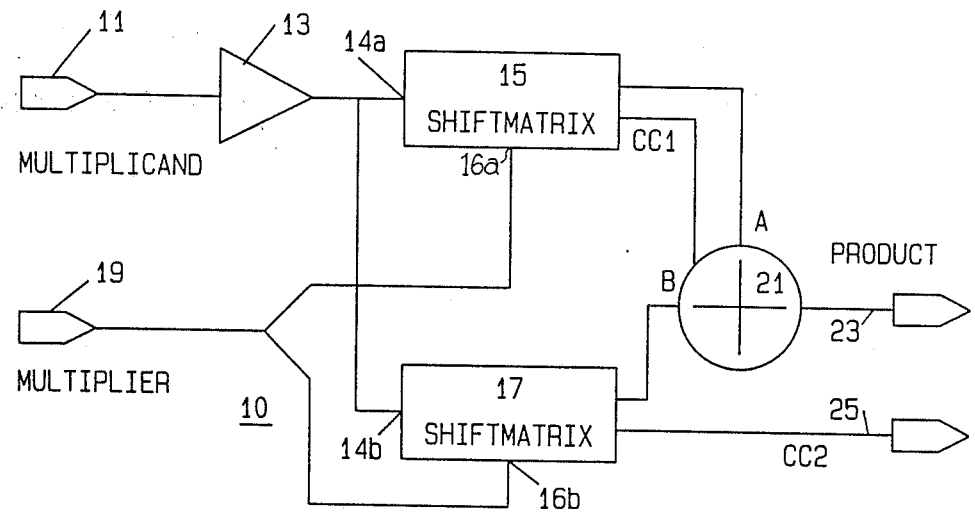
FIG. 1 is a block diagram of a partial canonical signed digit (PCSD) multiplier constructed in accordance with the present invention.

FIG. 1 is a block diagram of a PCSD multiplier circuit 10 embodying the invention. An 8-bit two's complement multiplicand is applied to input 11. The multiplicand is coupled via a buffer 13 to the multiplicand input 14a of a first shift matrix 15 and to the multiplicand input 14b of a second shift matrix 17. Thus in the circuit of FIG. 1 the 8-bit multiplicand is applied to the inputs of each one of the two shift matrices 15, 17. An 8-bit multiplier control word is shown applied to a terminal 19. In fact, terminal 19 represents 8 input lines, each line carrying a different one of the 8-bits forming the control word (as will be explained more fully in connection with FIGS. 2–4). The control word is divided into two groups of four, each group of four being defined as a "nibble". One nibble is applied to the multiplier input 16a of the first shift matrix 15 and the other nibble is applied to the multiplier input 16b of the second shift matrix 17. An 11-bit partial product is generated in each shift matrix. The 11-bit partial product (A) of the first shift matrix 15 and a carry input (CC1) produced in the first shift matrix are applied to a binary full adder 21. The partial product (B) produced in the second shift matrix 17 is also applied to adder 21 Whereby adder 21 produces at its output 23 an 11-bit binary output. As is well known, a binary full adder typically accepts two addend inputs and a carry input and produces sum and carry outputs. Thus the output 23 of adder 21 is the sum of its 3 inputs (the 3 inputs being the partial products A and B of the first and second shift matrices 15, 17 and of the carry control output CC1 of the first shift matrix 15). In addition, a carry control signal CC2 generated in the second shift matrix 17 is available to control the carry input of the next adder stage in the system (see FIG. 2).

Figure 2:
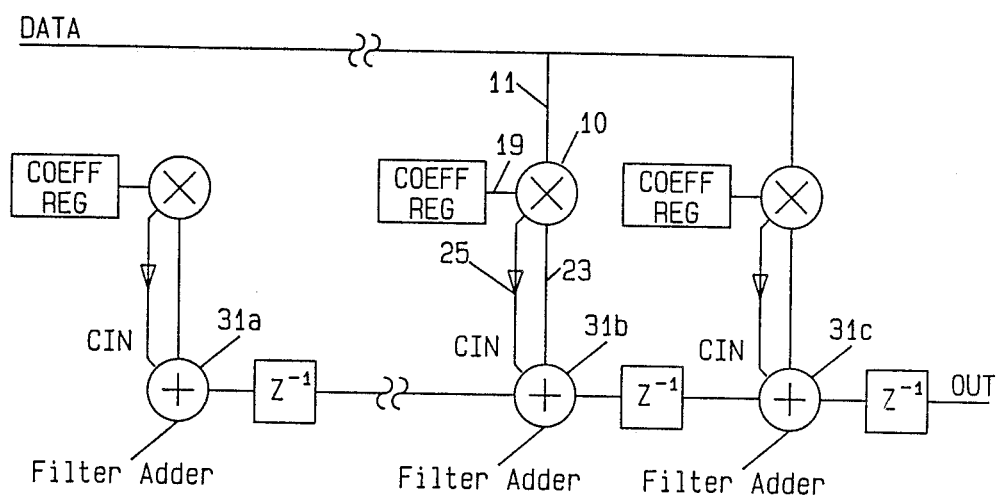
FIG. 2 is a block diagram of a portion of a Finite Impulse Response (FIR) digital filter employing a PCSD multiplier of the type shown in FIG. 1.

FIG. 2 shows the PCSD multiplier 10 used in an FIR filter. The carry control output (CC2) of the PCSD multiplier 10 is used to control the carry inputs (CIN) of "filter adders" such as 31a, 31b, 31c shown in FIG. 2, thus completing the multiply function. Similarly to the adder 21 mentioned above, each such filter adder 31a, 31b, 1c, etc., is a conventional "full adder" and therefore has the conventional two addend inputs plus one carry input. That fact is taken advantage of in a special manner as will be explained below.

Figure 3:
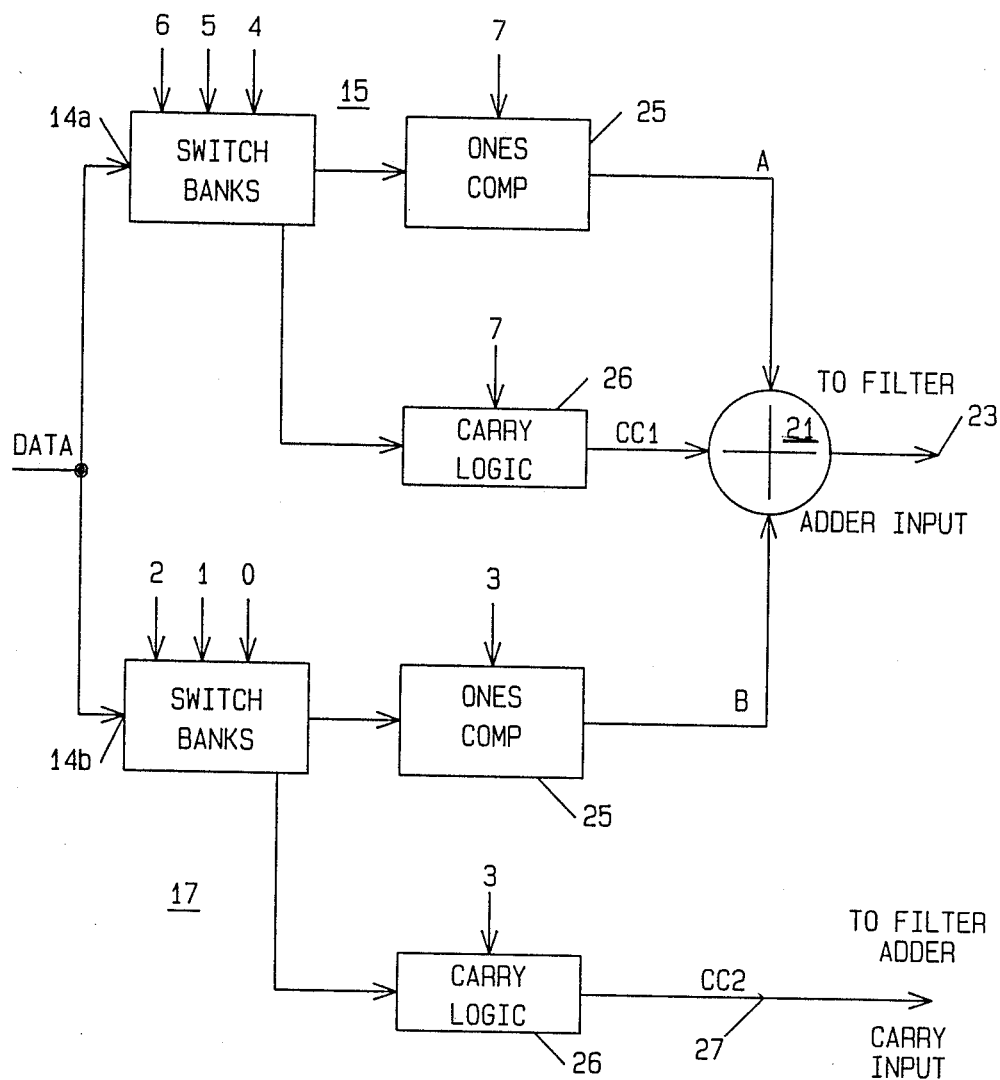
FIG. 3 is a more detailed block diagram of a PCSD multiplier embodying the invention and suitable for use in the system of FIG. 2.

The structure of the shift matrix (15 or 17) is presented in more detail in FIG. 3. A unique feature of the multipliers is the way product truncation is accomplished. The design does not use two's complement circuit to handle negative multipliers because they are very slow and consume too much area. Instead, a simple one's complementer 25 is used internal to each shift matrix block 15, 17 and one is added by selectively controlling the carry input of a subsequent adder such as 21 or 31. Efficient control of the carry input is a unique feature which is provided by means of carry logic circuits 26 contained within each of shift matrices 15 and 17. Each of the two multiplier nibbles could have negative values—this would require adding two or equivalently adding one twice. Addition of the second one is accomplished by outputting a control line 27 to be used as a carry input control in the next adder stage in the system—this is always possible in FIR filter structures. As noted above, FIG. 2 shows how the carry control output CCD of the PCSD multiplier 10 is used to control the carry input of the filter adders 31 in an FIR structure.

Figure 4:
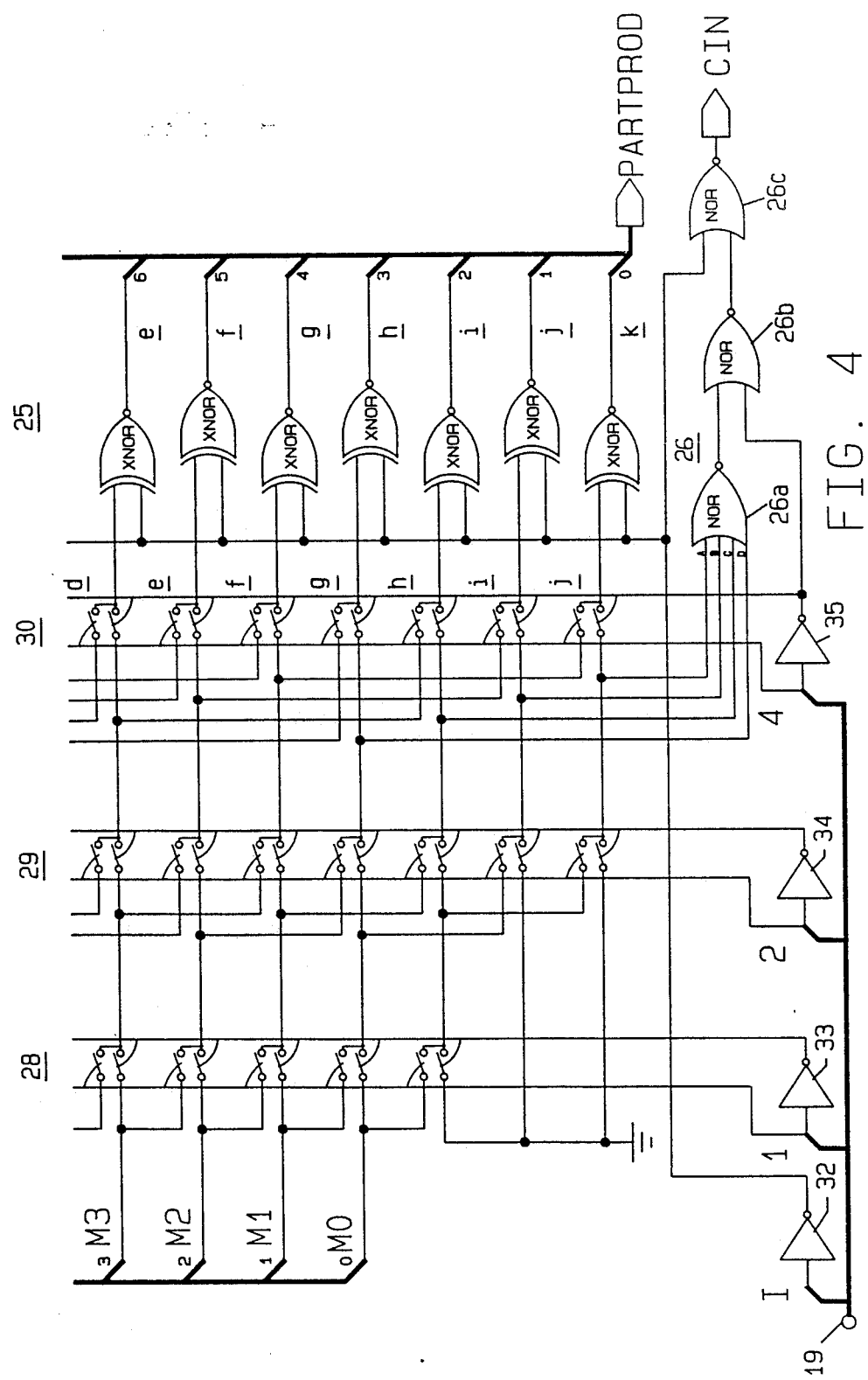
FIG. 4 is a detailed schematic diagram of the details of logic circuits for generating carry signals.
Figure 5:
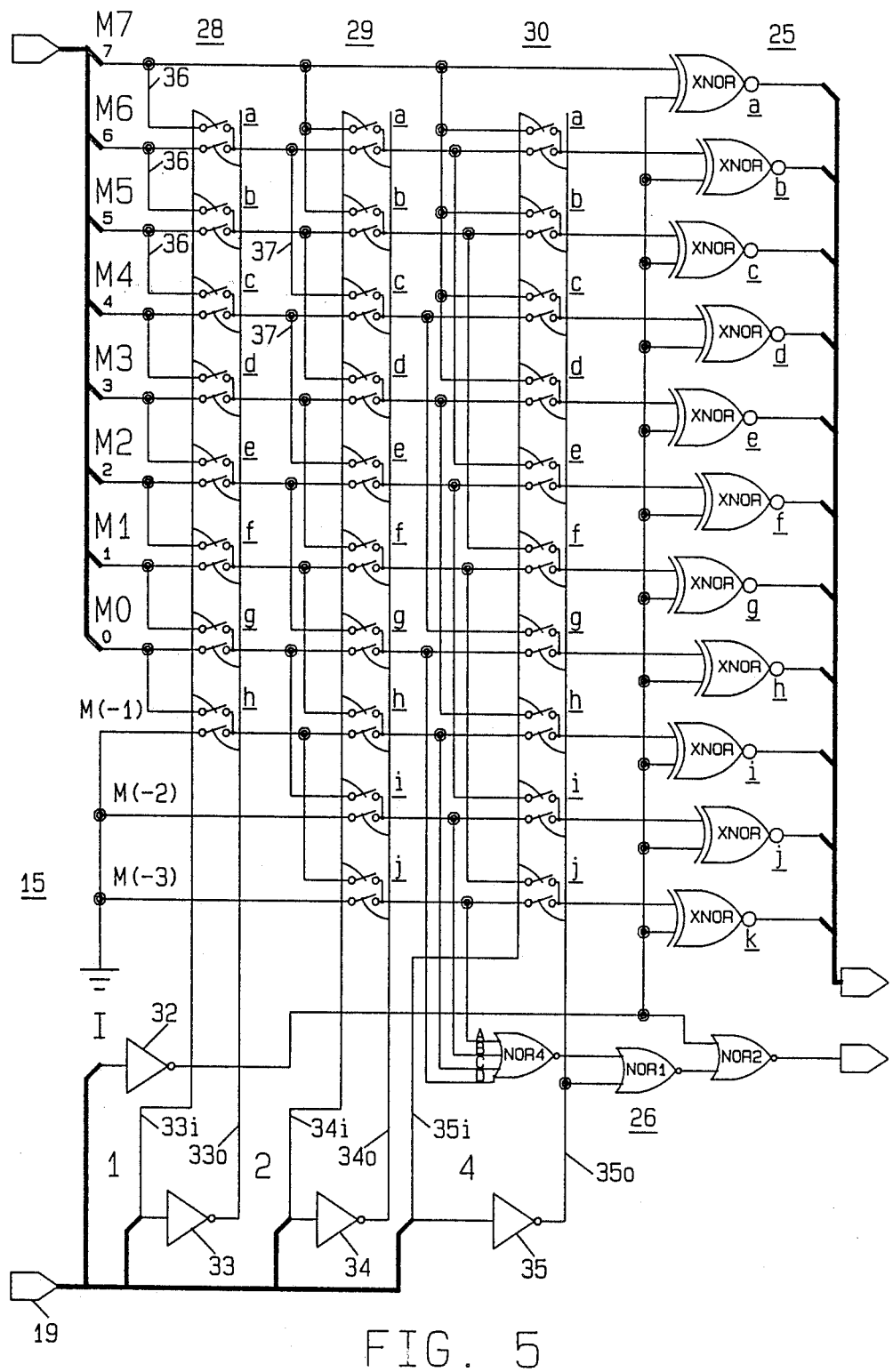
FIG. 5 is detailed schematic diagram of a shift matrix circuit constructed in accordance with the present invention.

FIGS. 4 and 5 show the logic used to generate the carry control signals (CC1 and/or CC2) produced at the output of each shift matrix 15, 17. One complete shift matrix (e.g 15) is shown in FIG. 5 and includes three banks of controllable paired switches 28a-h, 29a-j and 30a-j, four inverting multiplier input stages 32, 33, 34 and 35 to which the multiplier bits of one nibble are applied, an eleven bit one's complementer output arrangement 25 and a three gate carry logic arrangement 26.

In the shift matrix 15, each of the bits of the four bit multiplier nibble provided at terminal 19 is applied to the appropriate one of the multiplier input stages 32-35 in a conventional manner by means of clocking or enabling signals (not shown). Thus the multiplier sign bit (designated "I") is applied at the input or inverter stage 32, the "shiftright by one" bit (designated "1") is applied at the input of inverter stage 33, the "shiftright by two" bit (designated "2") is applied at the input or inverter stage 34 and the "shift right by four" bit (designated "4") is applied at the input of inverter stage 35.

In the case where any of the "1", "2" or "4" inputs is in the "zero" state, the respective inverter 33, 34, 35 will provide a "one" at its output. Conversely, if the inputs "1", "2" or "4" are in a "on" state, a zero output is provided. In the corresponding bank of switches (switches 28a-h correspond to inverter 33, switches 29a-j correspond to inverter 34, etc.), a plurality of pairs of switches is provided. The paired switches operate in complementary manner (i.e. one is open when the other in closed and vice versa) in response to the state of associated control lines (33i from the input or 33o from the output of the associated inverter such as 33). As shown in FIG. 5, a lower switch in each pair is open when the associated multiplier bit input is one and is closed when the associated multiplier bit input is zero. The latter condition would signify that no shifting of the input multiplier bits should take place. Inspection of FIG. 5 will show that, in that case, all of the multiplier bits M0-M6 will pass through switch bank 28 without experiencing any shift (multiplication). The most significant (sign) bit M7 passes directly along a line to one's complementer 25. Shift connection lines 36 are provided between adjacent bit lines (e.g, M7 and M6, M6 and M5, etc.) via the upper halves of the paired switches 28a-h when such upper halves are closed and the lower halves are opened. Thus, if the control input (multiplier bit) applied to the input of inverter 33 is a "one", signifying that a "multiply by one-half" or "shiftright by one" is to take place, all of the upper halves of the paired switches 28a-h will be closed and the lower halves of the paired switches 28a-h will be open. In that case, the multiplicand bit M7 also will be shifted via a shift connector line 36 and the upper switch of pair 28a to the next lower bit line. The same shifting (one bit right) will take place for all bits in the incoming multiplicand. Furthermore, in view of the fact, as noted above, that the output of the multiplier 15 is not a full sixteen bit output but rather is truncated at eleven bits, only three additional lower order bit lines labelled M(−1), M(−2) and M(−3) are provided in shift matrix 15. The inputs of each of the three last-named lines are grounded (zero). As will be seen below, since the outputs of the switch bank 30 are applied to exclusive NOR gates 25 in the associated one's complementer along with multiplier "sign" information, the three zeroes will be converted to one's if the multiplier sign is negative and will remain zeroes otherwise.

In a similar manner, it can be seen that inverter 34 in association with switch bank 29a-j (ten switch pairs are required in bank 29 to take into account the lower order bits such as M(−2) and M(−3)) operates to switch input multiplicand bits two places to the right wherever the upper halves of switches 29a-j are closed. Thus, if both inverter 33 and inverter 34 are provided with a "one" at their inputs, the incoming multiplicand digits M0-M7 will be shifted right (downward in FIG. 5) by three bit places.

Finally, inverter 35 in association with the "shift by four" switch bank 30a-j serves to selectively multiply the incoming multiplicand bits by an additional factor of 1/16 (shift by four bit places to the right).

The eleven bit output from switch bank 30a-j is supplied to one's complementer stage 25 which comprises eleven exclusive NOR gates 25a-k, with one gate for each of the eleven output bit lines. One of the inputs to each of the NOR gates 25a-k is supplied from the output of the multiplier sign inverter stage 32. A second input to each of the NOR gates 25a-k is provided by the eleven bit partial product. The complementer stage 25 simply provides a one's complement, as required, under control of the sign bit of the applied multiplier nibble.

In addition, it should be noted that the sign information (M7) associated with the multiplier is appropriately loaded into one, two or four additional more significant bit stages (see connections to M7 line via upper halves of switches 28a, 29a and 29b, and 30a-d) depending upon the states of inverters 33, 34 and 35.

In order to provide a consistent two's complement product at the output of shift matrix 15, an appropriate signal must be generated to effectively add "one" into the least significant bit position of the non-trucated one's complement form of the generated partial product by appropriately adding (or not adding) "one" to the least significant bit of the truncated partial product output.

In FIG. 5, the carry control outputs of the shift matrix 15 (or 17) control a ∓carry" input of the adder stage 21 (or 31) and are generated using only three gates. In FIG. 4, the three gates are illustrated as a four input NOR gate 26a, a two input NOR gate 26b, and a two input NOR gate 26c. This logic is needed to maintain consistent two's complement arithmetic with truncation. This control logic is small and fast and much more efficient than a two's complementer stage because it uses functions already generated within the shift matrix 15 (or 17) as inputs. This control logic is a significant feature of the multiplier design.

The adder carry input control logic eliminates the need for a two's complementer while maintaining correct truncated two's complement arithmetic. By using certain logic functions automatically generated in the shift matrix as inputs to the carry input control logic block the amount of logic is held to a minimum. The truth table for the CIN function produced at the output of NOR gate 26c is given by FIG. 6.

In FIG. 6 the table headings refer to FIG. 4 (or 5). MOB is the complement of the zeroth bit of the multiplicand. Similarly, M1B is the complement ("bar") of the first bit of the multiplicand, and so on. The following Boolean expression is derived from the truth table where A, B, C, and D are labeled in FIGS. 4 and 5. The symbol ∼ is intended to represent the unary complement operator. $CIN = I \cdot (\bar{A} \cdot \bar{B} \cdot \bar{C} \cdot \bar{D}) \cdot 4 + I \cdot \bar{4} = I \cdot (\sim(A+B+C+D) \cdot 4 + \bar{4}) = \sim(\bar{I} + \sim(A+B+C+D) + \bar{4}))$.

The result of the foregoing is that the logic means associated with each of the shift matrices 15, 17 is arranged to evaluate the bits truncated from each of the partial product outputs as a function of the magnitude and sign of the associated multiplier bits to provide first and second carry signal outputs suited for forming two's complement forms of the respective truncated one's complement partial products. That is, the foregoing logic evaluates the values of the bits truncated from the partial product output effectively to determine whether a one added to the least significant bit of the non-truncted product would cause a carry into the least significant bit of the truncated partial product. Based upon that information and the value of the multiplier (and its sign), the logic circuit 26 provides the necessary "carry" signal output to convert the truncated one's complement form of the partial product output to the correct two's complement value. The system utilizes signals available in the switch banks 28, 29, 30.

Specifically, the system is arranged to recognize that, when the multiplier inputs to the one's complementer gates 25h-k are zero and the sign of the multiplier nibble is negative (signifying a one's complement operation should occur) and a shift by four or more is required by the magnitude of the applied multiplier nibble, all of the truncated bits in the one's complement output would be one's, thereby signifying that a CIN output should be generated.

The realization of the CIN (carry input) function is best shown in FIG. 4. It will readily be recognized by persons familiar with logic circuit design that NAND logic may be utilized as well as the NOR logic shown.

The multiplier has been extensively modeled by both circuit and logic simulator techniques using a Mentorgraphics workstation. Behavioral modeling of the multiplier coupled with exhaustive comparison of the model to the "transistor level description" ensure that the intended function has been implemented at the transistor level. The high level behavioral model is the formal implementation of the software specification describing the functionality of the multiplier; it implements the entire truth table. The simulation compared the transistor level description of one actual implementation to a software model written in a straightforward fashion; it performs two's complementation, carries extra bits on MSD side and truncates as its last operation.

The model property with the value of mult on the symbol tells the simulator that a Pascal program of like name describes the behavior of the symbol. The code for the Pascal program which models the functional multiplier behavior is appended to the end of this document (Appendix A).

This model was compared exhaustively to a "transistor" description of the circuit by running the logic simulator. The comparison was conducted by driving both the behavioral model description and the primitive description with the same counter and then instructing the simulator to test the circuit outputs for any differences and to break if a difference is found. This comparison insures correct products for all possible multipliers and multiplicands—it takes one day to run the simulation.

```
(0001) [*********************************************************************
(0002)
(0003)  This model for the csd multipliers uses 2's complementation and does not generate a carry control line the way
(0004)  the csd structure in the filter does.  It will be used as a subroutine in the full datapath model of the csd
(0005)  filter.  This model accepts an uncomplemented multiplicand unlike the csd that was realized in the tal3073a.
(0006)
(0007) *********************************************************************]
(0008)
(0009) module mult;  $include '/sys/ins/base.ins.pas';
(0010) [%debug]     $include '/sys/ins/vfmt.ins.pas';
(0011) [%debug]     $include '/idea/sys/ins/sim.ins.pas';
(0012) [%list]
(0001) [ SIM.INS.PAS release 1.0
(0002)   SIM.INS.PAS -- This module contains the info needed to make functional models run.
(0003) ]
(0004) ( history:
(0005)     21 Oct   82 -- bv  -- Release 1.0
(0006)     17 Aug   82 -- bv  -- Initial coding
(0007) )
(0008)
(0009) CONST
(0010)   ( Signal strengths )
(0011)   sim_$strong     = 3 ;
(0012)   sim_$resistive  = 2 ;
(0013)   sim_$hi_z       = 1 ;
(0014)
(0015)   ( Signal values )
(0016)   sim_$zero       = 1 ;
(0017)   sim_$unknown    = 2 ;
(0018)   sim_$one        = 3 ;
(0019)
(0020)   ( Signal states )
(0021)   sim_$0z  = chr(1) ;
(0022)   sim_$Xz  = chr(2) ;
(0023)   sim_$1z  = chr(3) ;
(0024)   sim_$0r  = chr(4) ;
(0025)   sim_$Xr  = chr(5) ;
(0026)   sim_$1r  = chr(6) ;
(0027)   sim_$0s  = chr(7) ;
(0028)   sim_$Xs  = chr(8) ;
(0029)   sim_$1s  = chr(9) ;
(0030)
(0031)   ( Drive property )
(0032)   sim_$zzz  = 1 ;        sim_$rzz  = 10 ;        sim_$szz  = 19 ;
(0033)   sim_$zzr  = 2 ;        sim_$rzr  = 11 ;        sim_$szr  = 20 ;
(0034)   sim_$zzs  = 3 ;        sim_$rzs  = 12 ;        sim_$szs  = 21 ;
(0035)   sim_$zrz  = 4 ;        sim_$rrz  = 13 ;        sim_$srz  = 22 ;
(0036)   sim_$zrr  = 5 ;        sim_$rrr  = 14 ;        sim_$srr  = 23 ;
(0037)   sim_$zrs  = 6 ;        sim_$rrs  = 15 ;        sim_$srs  = 24 ;
(0038)   sim_$zsz  = 7 ;        sim_$rsz  = 16 ;        sim_$ssz  = 25 ;
(0039)   sim_$zsr  = 8 ;        sim_$rsr  = 17 ;        sim_$ssr  = 26 ;
(0040)   sim_$zss  = 9 ;        sim_$rss  = 18 ;        sim_$sss  = 27 ;
(0041)
(0042)   ( Constants for MIN, TYP, or MAX timing; values returned by sim_$timing_type )
(0043)   sim_$min_timing  = 1 ;
(0044)   sim_$typ_timing  = 2 ;
(0045)   sim_$max_timing  = 3 ;
```

```
[0046] TYPE
[0047]       { PIN VALUE DEFINITIONS }
[0048]
[0049]       { The least significant bit of a bit string is always bit 0. The most
[0050]         significant bit is bit N where N is the width of the pin minus one.
[0051]         EXAMPLE:
[0052]           For an 8 bit pin the least significant bit is bit 0 in the bit string
[0053]           array, the most significant bit is bit 7 in the bit string array.
[0054]       }
[0055]       sim_$bit_string_t = PACKED ARRAY [0..255] OF CHAR ;
[0056]
[0057]       sim_$pin_value_ptr_t = ^sim_$pin_value_t ;
[0058]
[0059]       sim_$pin_value_t = PACKED RECORD
[0060]         pin_width   :   0..255 ;                        { width-1 of the pin  }
[0061]         bits        :   sim_$bit_string_t ;             { bits }
[0062]       END;
[0063]       { *** Note: pin_width is the width of the pin - 1. A single bit pin has
[0064]             a width of 0. Think of the width as actually being the number
[0065]             of the most significant bit.
[0066]       }
[0067]
[0068]       { PIN DEFINITION }
[0069]
[0070]       sim_$pin_ptr_t    =   ^sim_$pin_t ;
[0071]       sim_$pin_t        =   sim_$pin_value_ptr_t ;      {value of the pin *256 bit limit*}
[0072]
[0073]       { PIN HANDLER PRIORITY }
[0074]       sim_$priority_t   =   1..3 ;
[0075]
[0076] VAR
[0077]       { Define arrays for state data conversion }
[0078]       sim_$con_strength   :   EXTERN ARRAY[sim_$0z..sim_$1s] OF INTEGER16 ;   [strength from state]
[0079]       sim_$con_value      :   EXTERN ARRAY[sim_$0z..sim_$1s] OF INTEGER16 ;   [value from state]
[0080]       sim_$con_state      :   EXTERN ARRAY[sim_$zero..sim_$hi_z..sim_$strong] OF CHAR ;  [state from value and strength]
[0081]       sim_$con_drive      :   EXTERN ARRAY[sim_$zero..sim_$sss, sim_$zero..sim_$one] OF CHAR ;  [state from drive and value]
[0082]       sim_$con_and        :   EXTERN ARRAY[sim_$zero..sim_$zzz..sim_$zero..sim_$one] OF INTEGER16 ;  [AND two values]
[0083]       sim_$con_or         :   EXTERN ARRAY[sim_$zero..sim_$one, sim_$zero..sim_$one] OF INTEGER16 ;  [OR two values]
[0084]       sim_$con_xor        :   EXTERN ARRAY[sim_$zero..sim_$one, sim_$zero..sim_$one] OF INTEGER16 ;  [XOR two values]
[0085]
[0086]       { Define a variable for DFI access. All DFI procedures except dfi_$init and
[0087]         dfi_$term are now available to BL models. The design file opened by SIM is
[0088]         available to BL models through DFI using sim_$dfi_channel as the dfi channel
[0089]         identifier.
[0090]       }
[0091]       sim_$dfi_channel    :   EXTERN UNIV_PTR ;
[0092]
[0093]       { *** EXTERNAL PROCEDURES *** }
[0094]
[0095]       { Memory allocate and deallocate procedures }
[0096]       PROCEDURE sim_$allocate(
[0097]         IN  len :   INTEGER16 ;
[0098]         OUT ptr :   UNIV_PTR ) ;                        EXTERN ;
```

```
PROCEDURE sim_$deallocate(
    IN len         : INTEGER16 ;
    IN OUT ptr     : UNIV_PTR ) ;                          EXTERN ;

{ Procedures to save and restore the model state }
PROCEDURE sim_$save(
    IN record_len  : INTEGER16 ;
    IN record_ptr  : UNIV_PTR ) ;                          EXTERN ;

PROCEDURE sim_$restore(
    IN record_len  : INTEGER16 ;
    IN record_ptr  : UNIV_PTR ) ;                          EXTERN ;

{ Message prints a message to the simulator transcript window }
PROCEDURE sim_$message(
    IN message     : UNIV STRING ;
    IN len         : INTEGER16 ) ;                         EXTERN ;

{ Net name finds the name of a net connected to a pin }
PROCEDURE sim_$net_name(
    IN pin_ptr        : sim_$pin_ptr_t ;
    OUT net_name      : UNIV STRING ;
    IN OUT net_name_len : INTEGER16 ) ;                    EXTERN ;

{ Output routines -
  drive_delay_output uses the Drive, Rise, and Fall properties assigned to the pin.
  delay_output only uses the Rise and Fall properties assigned to the pin.
  drive_output only uses the Drive property assigned to the pin.
  output ignores all of the output properties given to the pin and schedules
      the event as specified in the parameters of the procedure call.

*** Note: pin_ptr must be to an output pin for all four output procedures
           or else the call will result in a simulator crash. Output pins appear
           in the pin file as: <model>_$O$<pin> : sim_$pin_ptr_t ;
}
PROCEDURE sim_$drive_delay_output(
    IN pin_ptr     : sim_$pin_ptr_t ;
    IN node_bits   : UNIV sim_$bit_string_t ) ;            EXTERN ;

PROCEDURE sim_$delay_output(
    IN pin_ptr     : sim_$pin_ptr_t ;
    IN node_bits   : UNIV sim_$bit_string_t ) ;            EXTERN ;

PROCEDURE sim_$drive_output(
    IN pin_ptr     : sim_$pin_ptr_t ;
    IN node_bits   : UNIV sim_$bit_string_t ;
    IN delay       : INTEGER16 ) ;                         EXTERN ;

PROCEDURE sim_$output(
    IN pin_ptr     : sim_$pin_ptr_t ;
    IN node_bits   : UNIV sim_$bit_string_t ;
    IN delay       : INTEGER16 ) ;                         EXTERN ;

{ Race checks to see if an input pin is waiting for delayed input. Always
  returns FALSE unless a RISE or FALL property was put on the input pin.
  *** Note: pin_ptr must point to an input pin. Input pins appear in the
      pin file as <model>_$I$<pin> : sim_$pin_ptr_t ;
```

```
[0163]  }
[0164]  FUNCTION sim_$race(
[0165]      IN pin_ptr           :  sim_$pin_ptr_t )  : BOOLEAN ;       EXTERN ;
[0166]  ( Race warning prints a warning message that a potential race was discovered.
[0167]  PROCEDURE sim_$race_warning(
[0168]      IN pin_ptr           :  sim_$pin_ptr_t ) ;                  EXTERN ;
[0169]
[0170]  ( In_only_value finds a value for the net driven by pin_ptr with the assumption
[0171]    that pin_ptr is not driving the net.
[0172]    *** Note: pin_ptr must point to an output pin.
[0173]  }
[0174]  PROCEDURE sim_$in_only_value(
[0175]      IN pin_ptr           :  sim_$pin_ptr_t ;
[0176]      OUT value            :  UNIV sim_$bit_string_t ) ; EXTERN ;
[0177]
[0178]  ( Modelfile property returns a TRUE value if the modelfile property was found,
[0179]    and a FALSE value if not. The value of the property is returned by
[0180]    property_value.  This procedure is only useful during ALLOCATE time.
[0181]  }
[0182]  FUNCTION sim_$modelfile_prop(
[0183]      OUT property_value       :  UNIV STRING ;
[0184]      IN OUT property_value_len :  INTEGER16 )     : BOOLEAN ;    EXTERN ;
[0185]
[0186]  ( Define entry point sets up an entry point that can be scheduled for the
[0187]    model by the simulator (using the activate routine.  A TRUE value is returned
[0188]    if the entry point was found in the global name table, a FALSE if not.
[0189]    The entry point variable returned by the routine should be used later
[0190]    whenever a call is made to activate for this entry point.
[0191]  }
[0192]  FUNCTION sim_$define_entry_point(
[0193]      IN entry_point_name     :  UNIV STRING ;
[0194]      IN entry_point_name_len :  INTEGER16 ;
[0195]      OUT entry_point         :  UNIV_PTR )    : BOOLEAN ;     EXTERN ;
[0196]
[0197]  ( Activate schedules an entry point to be activated after a specified delay.
[0198]  PROCEDURE sim_$activate(
[0199]      IN entry_point       :  UNIV_PTR ;
[0200]      IN delay             :  INTEGER16 ) ;                        EXTERN ;
[0201]
[0202]  ( Enable turns on pin handler that was turned off by sim_$disable.
[0203]    *** Note: pin_ptr must point to an input pin
[0204]  }
[0205]  PROCEDURE sim_$enable(
[0206]      IN pin_ptr           :  sim_$pin_ptr_t ) ;                  EXTERN ;
[0207]
[0208]  ( Disable turns off a pin event handler.
[0209]    *** Note: pin_ptr must point to an input pin
[0210]  }
[0211]  PROCEDURE sim_$disable(
[0212]      IN pin_ptr           :  sim_$pin_ptr_t ) ;                  EXTERN ;
```

```
[0220] ( Break causes the simulator to stop after processing all events at
[0221]   the current time. No break message is printed - see the sim_$message
[0222]   procedure.
[0223] )
[0224] PROCEDURE sim_$break ;                                              EXTERN ;
[0225]
[0226] ( The following functions all perform time conversions.  The internal simulator
[0227]   views time as a series of discrete time increments refered to as timesteps.
[0228]   The above output procedures that require a specific delay need the delay value
[0229]   in timesteps. sim_$user_to_timestep returns a timestep time value from
[0230]   user time, sim_$nsec_to_timestep returns a timestep time value from a time
[0231]   value in nanoseconds.  sim_$time returns the current time (in timesteps).
[0232] )
[0233] FUNCTION sim_$user_to_timestep(
[0234]   IN user_time         :   REAL  )              :   INTEGER32 ;      EXTERN ;
[0235]
[0236] FUNCTION sim_$nsec_to_timestep(
[0237]   IN nsec              :   REAL  )              :   INTEGER32 ;      EXTERN ;
[0238]
[0239] FUNCTION sim_$time                              :   INTEGER32 ;      EXTERN ;
[0240]
[0241] (Version 3.0 procedures)
[0242]
[0243] ( Sim_$get_instance returns a dfi_$object_identifier for this instance.
[0244]   DFI is initialized by SIM and the design file is opened (in read only mode)
[0245]   for the use of BL models.
[0246]   BL models must not call dfi_$init or dfi_$term.
[0247] )
[0248] FUNCTION sim_$get_instance_id                   :   INTEGER32 ;      EXTERN ;
[0249]
[0250] ( Sim_$get_pin_ptr takes a dfi_$object_identifier for a pin and returns a
[0251]   sim_$pin_ptr_t for an IN type pin.
[0252] )
[0253] FUNCTION sim_$get_pin_ptr(
[0254]   IN object_id         :   INTEGER32  )         :   sim_$pin_ptr_t ;
[0255]                                                                      EXTERN ;
[0256]
[0257] ( Sim_$set_pin_priority sets the priority of pin handlers that are called
[0258]   during the same iteration. Priority can be set from 1 to 3 with 3 being
[0259]   the highest priority.  Pin handlers installed by SIM have a default priority
[0260]   of 1.  The pin_ptr is from either the instance record or
[0261]   from the sim_$get_pin_ptr function. The entry point argument should be
[0262]   derived from the a call to sim_$define_entry_point. Pin handler priorities
[0263]   should be set only during allocate time.
[0264] )
[0265] PROCEDURE sim_$set_pin_priority(
[0266]   IN pin_ptr           :   sim_$pin_ptr_t ;
[0267]   IN entry_point       :   UNIV_PTR ;
[0268]   IN priority          :   sim_$priority_t ) ;                       EXTERN ;
[0269]
[0270] ( sim_$install_pin_handler installs a new pin handler for a model.  The
[0271]   pin_ptr should be an input pin from either the instance record or from
[0272]   a call to sim_$get_pin_ptr. The entry_point is from a call to
[0273]   sim_$define_entry_point. The priority is a value from 1 to 3 as in the
```

```
[0278]      call to sim_$set_pin_priority.  The pin handler should be installed only
[0279]      during allocate time.
[0280]  )
[0281]  PROCEDURE sim_$install_pin_handler(
[0282]      IN  pin_ptr         :   sim_$pin_ptr_t ;
[0283]      IN  entry_point     :   UNIV_PTR ;
[0284]      IN  io_pin          :   BOOLEAN ;
[0285]      IN  priority        :   sim_$priority_t )  ;          EXTERN ;
[0286]
[0287]  (
[0288]    The sim_$iteration_count function returns the current value of the AC
[0289]    iteration count if the simulator is currently executing the run command, or
[0290]    the DC iteration count if the simulator is currently executing the
[0291]    initialize command.
[0292]  )
[0293]  FUNCTION sim_$iteration_count       :   INTEGER16 ;              EXTERN ;
[0294]
[0295]  (
[0296]    Information about future scheduled events on a pin can be retrieved
[0297]    using the sim_$get_future_event function.  This function takes one input
[0298]    parameter and returns two output parameters.  The input parameter is the
[0299]    sim_$pin_ptr_t pointing to the output version of the output pin.  The
[0300]    function value returned is a boolean that is TRUE if there is an event
[0301]    scheduled for this output pin, otherwise it is FALSE.  The first output
[0302]    parameter is a sim_$pin_value_ptr_t that points to the value of the
[0303]    future event.  This value is valid only if the function returns with a
[0304]    TRUE result.  The second return parameter is the time (in simulator
[0305]    timesteps) at which the event is scheduled.
[0306]  )
[0307]  FUNCTION sim_$get_future_event(
[0308]      IN  pin_ptr         :   sim_$pin_ptr_t ;
[0309]      OUT value_ptr       :   sim_$pin_value_ptr_t ;
[0310]      OUT time            :   INTEGER32 )   :   BOOLEAN ;
[0311]      EXTERN ;
[0312]
[0313]  (
[0314]    The following two procedures convert the internal SIM timesteps back into
[0315]    real time units.
[0316]  )
[0317]  FUNCTION sim_$timestep_to_user(
[0318]      IN  timesteps       :   INTEGER32 )   :   REAL ;            EXTERN ;
[0319]
[0320]  FUNCTION sim_$timestep_to_nsec(
[0321]      IN  timesteps       :   INTEGER32 )   :   REAL ;            EXTERN ;
[0322]
[0323]  FUNCTION sim_$timing_type           :   INTEGER16 ;              EXTERN ;
[0324]
[0013]  {%list}
[0014]          %include 'symbol.pf';
[0001]  (
[0002]    Pinfile     :   /user/larryt/ta13073a/mult_bl/symbol.pf
[0003]    Symbol      :   MULT_BL
[0004]    Version     :   4
[0005]    Model       :   mult
[0006]    Modelcode   :   mult.bin
[0007]  )
[0008]
```

```
[0009]  TYPE
[0010]      instance_ptr_t       =  ^instance_t ;
[0011]      instance_t           =  RECORD
[0012]           init_entry_point            :   UNIV_PTR ;
[0013]           user_data_area              :   UNIV_PTR ;
[0014]           in_pin_count                :   INTEGER16 ;
[0015]           out_pin_count               :   INTEGER16 ;
[0016]           mult_$I$CSDMULT             :   sim_$pin_ptr_t ;
[0017]           mult_$I$MPLICAND            :   sim_$pin_ptr_t ;
[0018]           mult_$I$PRODUCT             :   sim_$pin_ptr_t ;
[0019]           mult_$O$PRODUCT             :   sim_$pin_ptr_t ;
[0020]      END ;
[0021]
[0022]
[0023]  VAR
[0024]      simbase_$instance_ptr    :   EXTERN instance_ptr_t ;
[0025]
[0026]      type     my_data_p  =  ^my_data;                       (* instance data record *)
[0027]               my_data    =  record
[0028]                             end;
[0029]      const
[0030]          my_data_s = sizeof (my_data);
[0031]
[0032]      var      p:           my_data_p;
[0033]
[0034]  {$debug}  %include '/user/larryt/bl_lib/message.ins.pas';
[0035]  (*****************************************************************************************)
[0036]          (* set constants and allocate MEMORY *)
[0037]  procedure mult$$allocate;
[0038]  var i: integer;
[0039]      ptr: univ_ptr;
[0040]  begin
[0041]     with simbase_$instance_ptr^:i do begin
[0042]        if not sim_$define_entry_point('mult$$pin',9,ptr) then
[0043]               sim_$message('mult entry point generation failure',35);
[0044]               sim_$install_pin_handler(i.mult_$I$CSDMULT,ptr,false,1);
[0045]               sim_$install_pin_handler(i.mult_$I$MPLICAND,ptr,false,1);
[0046]     end
[0047]  end;
[0048]  (*****************************************************************************************)
[0049]          (* save and restore *)
[0050]  procedure mult$$save;
[0051]  begin
[0052]     sim_$save (my_data_s, simbase_$instance_ptr^.user_data_area)
[0053]  end;
[0054]
[0055]  procedure mult$$restore;
[0056]  begin
[0057]     sim_$restore (my_data_s, simbase_$instance_ptr^.user_data_area)
[0058]  end;
[0059]  (*****************************************************************************************)
```

```
(0057) procedure mult$$pin;
(0058)
(0059) var
(0060)    ai,bi                : integer16;
(0061)    i                    : integer16;
(0062)    maxneg               : boolean; { this argument serves no function: dummy argument to 2's comp routine }
(0063)    mplicand9            : sim_$pin_value_t;
(0064)    mplicand9_ptr        : sim_$pin_value_ptr_t;
(0065)    workstring2          : sim_$pin_value_t;
(0066)    workstr2_ptr         : sim_$pin_value_ptr_t;
(0067)    csdmulta             : sim_$pin_value_t;
(0068)    csdmulta_ptr         : sim_$pin_value_ptr_t;
(0069)    csdmultb             : sim_$pin_value_t;
(0070)    csdmultb_ptr         : sim_$pin_value_ptr_t;
(0071)    shftrby1             : sim_$pin_value_t;
(0072)    shftrby1_ptr         : sim_$pin_value_ptr_t;
(0073)    mplicand9a           : sim_$pin_value_t;
(0074)    mplicand9a_ptr       : sim_$pin_value_ptr_t;
(0075)    mplicand9b           : sim_$pin_value_t;
(0076)    mplicand9b_ptr       : sim_$pin_value_ptr_t;
(0077)    addend1              : sim_$pin_value_t;
(0078)    addend1_ptr          : sim_$pin_value_ptr_t;
(0079)    addend2              : sim_$pin_value_t;
(0080)    addend2_ptr          : sim_$pin_value_ptr_t;
(0081)    carryin              : sim_$pin_value_t;
(0082)    carryin_ptr          : sim_$pin_value_ptr_t;
(0083)    carryout             : sim_$pin_value_t;
(0084)    carryout_ptr         : sim_$pin_value_ptr_t;
(0085)    sum                  : sim_$pin_value_t;
(0086)    sum_ptr              : sim_$pin_value_ptr_t;
(0087)
(0088)
(0089) $include '/user/larryt/bl_lib/sim_bl.ins.pas';
(0090) [*************************************************************************]
(0001)
(0002) Function power (base, exponent : integer16) : integer32;
(0003) Var
(0004)    1,power1 : integer32;
(0005) Begin
(0006) If exponent < 0 then
(0007)    sim_$message('power is not a natural number',29)
(0008) Else If exponent = 0 then
(0009)    power1 := 1
(0010) Else
(0011)    begin
(0012)    power1 := base;
(0013)    i := 2;
(0014)    while i <= exponent do
(0015)       begin
(0016)       power1 := (power1 * base);
(0017)       i := i + 1
(0018)       end {while}
(0019)    end;
(0020) power := power1
(0021) end; {power}
(0022) [*************************************************************************]
(0023)
(0024)
```

```
[0025] [%debug]    procedure bit_string_out ( IN name          : string;
[0026] [%debug]                                IN len           : integer;
[0027] [%debug]                                IN pin_value_ptr : sim_$pin_value_ptr_t );
[0028] [%debug]
[0029] [%debug]    var i    : integer;
[0030] [%debug]    var text : Array [0..120] of char;
[0031] [%debug]
[0032] [%debug]    Begin
[0033] [%debug]       For i:=0 to len do text[i]:=name[i];
[0034] [%debug]       text[len+1]:=' ';
[0035] [%debug]       text[len+2]:='=';
[0036] [%debug]       text[len+3]:=' ';
[0037] [%debug]       For i:=(len+4) to (len+5+pin_value_ptr^.pin_width) do
[0038] [%debug]          Begin
[0039] [%debug]             If sim_$con_value[pin_value_ptr^.bits[i-(len+4)]]=sim_$one then text[i]:='1'
[0040] [%debug]             Else if sim_$con_value[pin_value_ptr^.bits[i-(len+4)]]=sim_$zero then text[i]:='0'
[0041] [%debug]             Else text[i]:='X'
[0042] [%debug]          End;
[0043] [%debug]       sim_$message(text, i)
[0044] [%debug]    End;
[0045] [%debug]
[0046] [%debug]
[0047]
[0048] (****************************************************************************
[0049] { Shifts an array extending from zero to (In_Data_ptr^.pin_width) shftrN places right with two's complement sign extend. }
[0050] { The output is M bits wide. ShftRn is P bits wide. If the shftrn value is unknown then the output is unknown.           }
[0051] {                                                                                 9-23-1986 Larry R. Tate                }
[0052]    procedure shftright (IN  in_data_ptr  : sim_$pin_value_ptr_t ;
[0053]                         IN  shftr_ptr    : sim_$pin_value_ptr_t ;                                Internal;
[0054]                         IN  out_data_ptr : sim_$pin_value_ptr_t );
[0055]
[0056]
[0057] Var
[0058]    unknown   : boolean;
[0059]    TempData  : sim_$bit_string_t;
[0060]    i         : integer16;
[0061]    N         : integer16;     { input array size: 0 to N-1   }
[0062]    M         : integer16;     { output array size: 0 to M-1  }
[0063]    P         : integer16;     { input array size of shftrN: 0 to P-1 }
[0064]    ShftRn    : integer16;     { magnitude of rightshift. }
[0065]
[0066]
[0067] Begin { ShftRight }
[0068]    N := in_data_ptr^.pin_width + 1;
[0069]    M := out_data_ptr^.pin_width + 1;
[0070]    P := shftr_ptr^.pin_width + 1;
[0071]    If ((N<>M) And (in_data_ptr=out_data_ptr)) then sim_$message('rightshift not possible due to unequal pin_widths',49);
[0072]    { Create a temporary data storage structure and initialize it to zero strong. }
[0073]    For i:=0 to M-1 do TempData[i]:=sim_$0s;
[0074]    { Compute the value of the desired shift. }
[0075]    unknown:=false;
[0076]    ShftRn:=0;
[0077]    For i:=0 to P-1 do begin
[0078]       ShftRn := ShftRn+((sim_$con_value[shftr_ptr^.bits[i]]-1) div 2)*power(2,i));
[0079]       if sim_$con_value[shftr_ptr^.bits[i]]=sim_$unknown then unknown:=true
[0080]    end;
[0081]    { Extend the Signbit }
[0082]    If unknown then for i:=0 to (M-1) do out_data_ptr^.bits[i] := sim_$xs
```

```
[0083]      Else
[0084]      begin
[0085]          For i:=0 to ShftRn do
[0086]              begin
[0087]                  TempData[M-1-i] := in_data_ptr^.bits[N-1]
[0088]              end;
[0089]          { Shift the remaining bits }
[0090]          For i:=(ShftRn+1) to (N-1+ShftRn) do
[0091]              begin
[0092]                  TempData[M-1-i] := in_data_ptr^.bits[ShftRn-1+N-1]
[0093]              end;
[0094]          For i:=0 to (M-1) do
[0095]              begin
[0096]                  out_data_ptr^.bits[i] := TempData[i]
[0097]              end
[0098]      end
[0099] End; { ShftRight }
[0100]
[0101] {*********************************************************************
[0102]  Adds two length In_Data_ptr^.pin_width sim_$bit strings : array indices range from zero to N. CarryIn, Sum and carryout
[0103]  Are also of the same type; they are all pointers to a record structure consisting of a sim_$bit_string which contains
[0104]  state information and an integer which contains the pin_width.
[0105]  Any unknown input value will cause all the more significant bits to be unknown.     9-23-1986 Larry R. Tate
[0106] *********************************************************************}
[0107]
[0108] procedure Adder (IN  addend1_ptr  : sim_$pin_value_ptr_t ;
[0109]                  IN  addend2_ptr  : sim_$pin_value_ptr_t ;
[0110]                  IN  carryin_ptr  : sim_$pin_value_ptr_t ;
[0111]                  IN  sum_ptr      : sim_$pin_value_ptr_t ;
[0112]                  IN  carryout_ptr : sim_$pin_value_ptr_t);       Internal;
[0113]
[0114] VAR
[0115]     c            : sim_$bit_string_t;
[0116]     N            : integer16;       { array size: 0 to N-1 }
[0117]     a,b,ps,sum,i : integer16;
[0118]
[0119] Begin { Adder }
[0120]     N := addend1_ptr^.pin_width + 1;
[0121]     If (addend1_ptr^.pin_width <> addend2_ptr^.pin_width) then sim_$message('addend pin_widths are not equal.',32);
[0122]     sum_ptr^.pin_width:=addend1_ptr^.pin_width; { pin_width is not changed. }
[0123]     carryout_ptr^.pin_width:=0;
[0124]     c[0] := carryin_ptr^.bits[0];
[0125]     for i := 0 to (N-1) do begin
[0126]         a := sim_$con_value(addend1_ptr^.bits[i]);
[0127]         b := sim_$con_value(addend2_ptr^.bits[i]);
[0128]         ps := sim_$con_xor [a,b];
[0129]         sum := sim_$con_xor [sim_$con_value(c[i]),ps];
[0130]         if (sum=sim_$one) then sum_ptr^.bits[i]:=sim_$1s
[0131]         else if (sum=sim_$zero) then sum_ptr^.bits[i]:=sim_$0s
[0132]         else sum_ptr^.bits[i]:=sim_$xs;
[0133]         if (a=sim_$one)and(b=sim_$one) then c[i+1]:=sim_$1s
[0134]         else if (a=sim_$zero)and(b=sim_$zero) then c[i+1]:=sim_$0s
[0135]         else if (ps=sim_$one) then c[i+1]:=c[i]
[0136]         else c[i+1]:=sim_$xs
[0137]     end; { For }
[0138]     carryout_ptr^.bits[0]:=c[N]
[0139] end; { Adder }
[0140]
[0141] {*********************************************************************}
[0142]
```

```
[0143]   { Takes Two's Complement of a length (In_Data_ptr^.pin_width) sim_$bit_string : array indices range from zero to N-1. }
[0144]   { The MaxNeg flag is set when the segment to be complemented is the most negative number.                               }
[0145]   { Any unknown input value will cause an N-bit zero output bitstring.                        9-22-1986 Larry R. Tate     }
[0146]
[0147]
[0148]   procedure TwosComp (IN  in_data_ptr   : sim_$pin_value_ptr_t ;
[0149]                       IN  out_data_ptr  : sim_$pin_value_ptr_t ;
[0150]                       OUT MaxNeg        : Boolean              );    Internal;
[0151]
[0152]   Var
[0153]     FoundOne        : boolean;
[0154]     FoundUnknown    : boolean;
[0155]     i               : integer16;
[0156]     N               : integer16;     { array size: 0 to N-1 }
[0157]
[0158]   Begin { TwosComplement }
[0159]     N := in_data_ptr^.pin_width + 1;
[0160]     out_data_ptr^.pin_width := in_data_ptr^.pin_width;    { pin_width does not change. }
[0161]     { Find the least signifigant one. }
[0162]     i := 0;
[0163]     FoundOne := False;
[0164]     FoundUnknown := False;
[0165]     Repeat
[0166]       FoundOne     := (sim_$con_value[in_data_ptr^.bits[i] = sim_$one);
[0167]       FoundUnknown := (sim_$con_value[in_data_ptr^.bits[i] = sim_$unknown);
[0168]       out_data_ptr^.bits[i] := In_data_ptr^.bits[i];
[0169]       i := i + 1
[0170]     Until (FoundOne or (i = N));
[0171]     MaxNeg := FoundOne And (i = N);
[0172]     {FirstPlusOne := i}
[0173]     { Flip all bits which are more signifigant then the least signifigant one. }
[0174]     while (i <= (N-1)) do
[0175]       begin
[0176]         FoundUnknown := (sim_$con_value[in_data_ptr^.bits[i] = sim_$unknown);
[0177]         out_data_ptr^.bits[i] := sim_$con_state[(4 - sim_$con_value[in_data_ptr^.bits[i]]),sim_$strong];
[0178]         i := i + 1
[0179]       end;
[0180]     If FoundUnknown then
[0181]       begin
[0182]         For i:= 0 to N-1 do in_data_ptr^.bits[i] := sim_$xs
[0183]       end
[0184]   End; { TwosComplement }
[0185]
[0186]   (*********************************************************************************)
[0187]   { Takes One's Complement of a length (In_Data_ptr^.pin_width) sim_$bit_string ; array indices range from zero to N-1. }
[0188]   { Any unknown input value will cause an N-bit zero output bitstring.                        9-22-1986 Larry R. Tate   }
[0189]
[0190]
[0191]   procedure OnesComp (IN  in_data_ptr   : sim_$pin_value_ptr_t ;
[0192]                       IN  out_data_ptr  : sim_$pin_value_ptr_t );         Internal;
[0193]
[0194]   Var
[0195]     FoundUnknown    : boolean;
[0196]     i               : integer16;
[0197]     N               : integer16;     { array size: 0 to N-1 }
[0198]
```

```
[0199] Begin ( OnesComplement )
[0200]   N := in_data_ptr^.pin_width + 1;
[0201]   out_data_ptr^.pin_width:=in_data_ptr^.pin_width;  ( pin_width does not change. )
[0202]   FoundUnknown := False;
[0203]   ( Flip all bits which are more signifigant then the least signifigant one. )
[0204]   i := 0;
[0205]   while (i <= (N-1)) do
[0206]     begin
[0207]       FoundUnknown := (sim_$con_value[in_data_ptr^.bits[i]] = sim_$unknown);
[0208]       out_data_ptr^.bits[i] := sim_$con_value[in_data_ptr^.bits[i]],sim_$strong];
[0209]       i := i + 1
[0210]     end;
[0211]   If FoundUnknown then
[0212]     begin
[0213]       For i:= 0 to N-1 do out_data_ptr^.bits[i] := sim_$xs
[0214]     end
[0215] End; ( OnesComplement )
[0216]
[0217]
[0218] (****************************************************************************
[0091]
[0092] begin
[0093] with simbase_$instance_ptr^ do begin
[0094]   p := user_data_area;
[0095]   with p^ do begin
[0096]     ai := sim_$con_value [mult_$i$csdmult^^.bits[0]];
[0097]     bi := sim_$con_value [mult_$i$csdmult^^.bits[4]];
[0098]     csdmulta.pin_width:=1;
[0099]     csdmultb.pin_width:=1;
[0100]     csdmulta_ptr:=addr(csdmulta);
[0101]     csdmultb_ptr:=addr(csdmultb);
[0102]     csdmulta.bits[0]:=mult_$i$csdmult^^.bits[1];
[0103]     csdmulta.bits[1]:=mult_$i$csdmult^^.bits[2];
[0104]     csdmultb.bits[0]:=mult_$i$csdmult^^.bits[5];
[0105]     csdmultb.bits[1]:=mult_$i$csdmult^^.bits[6];
[0106]
[0107]
[0108] ( Shift the two's complement datain right by one with sign extend thus going from an 8-bit
[0109]   data format to a 9-bit format.  This is necessary to handle the 2's complement of -128 :
[0110]   +128 cannot be represented by 8-bits. )
[0111] Begin ( ShftRight )
[0112]   shftrby1.pin_width:=0;
[0113]   shftrby1.bits[0]:=sim_$1s;
[0114]   shftrby1_ptr:=addr(shftrby1);
[0115]   mplicand9.pin_width:= 8;
[0116]   mplicand9_ptr:=addr(mplicand9);
[0117]   mplicand9a.pin_width:= 8;
[0118]   mplicand9a_ptr:=addr(mplicand9a);
[0119]   mplicand9b.pin_width:= 8;
[0120]   mplicand9b_ptr:=addr(mplicand9b);
[0121]   ShftRight(mult_$i$mplicand^,shftrby1_ptr,mplicand9_ptr)
[0122] end; ( ShftRight )
[0123]
[0124] ( Take the 9-bit 2's complements for the a and b partial products as required. )
[0125] If ai=sim_$one then TwosComp (mplicand9_ptr,mplicand9a_ptr,maxneg)
[0126] Else for I:=0 to (mplicand9.pin_width) do mplicand9a.bits[i]:=mplicand9.bits[i];
[0127] If bi=sim_$one then TwosComp (mplicand9_ptr,mplicand9b_ptr,maxneg)
[0128] Else for I:=0 to (mplicand9.pin_width) do mplicand9b.bits[i]:=mplicand9.bits[i];
```

```
(0129)  [%debug]    bit_string_out('mplicand9',9,mplicand9_ptr);
(0130)  [%debug]    bit_string_out('mplicand9a'',10,mplicand9a_ptr);
(0131)  [%debug]    bit_string_out('mplicand9b'',10,mplicand9b_ptr);
(0132)
(0133)          { Shift Right And Truncate to 12 bits for matrix a }
(0134)          csdmulta.pin_width:=2;
(0135)          csdmulta.bits[2]:=mult_$i$csdmult^^.bits[3];
(0136)          Begin { ShftRightAndTrunc }
(0137)             addend1.pin_width:= 11;
(0138)             addend1_ptr:=addr(addend1);
(0139)             ShftRight(mplicand9a_ptr,csdmulta_ptr,addend1_ptr)
(0140)          end; { ShftRightAndTrunc }
(0141)
(0142)          { Shift Right And Truncate to 12 bits for matrix b }
(0143)          csdmultb.pin_width:=2;
(0144)          csdmultb.bits[2]:=mult_$i$csdmult^^.bits[7];
(0145)          Begin { ShftRightAndTrunc }
(0146)             addend2.pin_width:= 11;
(0147)             addend2_ptr:=addr(addend2);
(0148)             ShftRight(mplicand9b_ptr,csdmultb_ptr,addend2_ptr)
(0149)          end; { ShftRightAndTrunc }
(0150)  [%debug]    bit_string_out('addend1',7,addend1_ptr);
(0151)  [%debug]    bit_string_out('addend2',7,addend2_ptr);
(0152)
(0153)          { Add addend1 to addend2 to form product }
(0154)          carryin.bits[0]:=sim_$0s;
(0155)          carryin.pin_width:=0;
(0156)          carryin_ptr:=addr(carryin);
(0157)          carryout_ptr:=addr(carryout);
(0158)          sum.pin_width:= 11;
(0159)          sum_ptr:=addr(sum);
(0160)          Adder(addend1_ptr,addend2_ptr,carryin_ptr,sum_ptr,carryout_ptr);
(0161)  [%debug]    bit_string_out('sum',3,sum_ptr);
(0162)
(0163)          { Remove the second most signicant bit and output the resulting 11-bit product.
(0164)          sum.bits[10]:=sum.bits[11];  }
(0165)          sum.pin_width:= 10;
(0166)  [%debug]    bit_string_out('product',7,sum_ptr);
(0167)          sim_$delay_output(mult_$o$product,sum.bits)
(0168)          end  (* with p *)
(0169)       end  (* with simbase *)
(0170)    end;
(0171)
(0172)  {**********************************************************************
```

```
(0173) procedure mult$$init;
(0174)
(0175)
(0176)  var
(0177)    i,j         : integer16;
(0178)    Unknown     : Boolean;
(0179)
(0180)
(0181)  begin
(0182)  with simbase_$instance_ptr^ do
(0183)    begin
(0184)    p := user_data_area;
(0185)    with p^ do
(0186)      begin
(0187)      Unknown:=false;
(0188)      For i := 0 to 7 do
(0189)        Unknown := unknown or ((sim_$con_value [mult_$i$mplicand^.bits[i]] = sim_$unknown)or(sim_$con_value
                    [mult_$i$csdmult^.bits[i]] = si
(0190)      If not Unknown then
(0191)        mult$$pin
(0192)      end (* with p *)
(0193)    end (* with simbase *)
(0194)  end;
```

What is claimed is:
1. A multiplier circuit comprising:
a first shift matrix having a data signal input for receiving an N-bit two's complement multiplicand signal which is to be weighted, a control signal input for receiving a first signed multiplier signal, and a first partial product output for providing a one's complement form of said N-bit two's complement multiplicand signal shifted by a first predetermined number of bit positions determined by the value of said first multiplier, said partial product being truncated to a number of bits less than 2N−1;
a second shift matrix having a data signal input for receiving said N-bit two's complement multiplicand signal which is to be weighted, a control signal input for receiving a second signed multiplier signal, and a second partial product output for providing a one's complement form of said N-bit two's complement multiplicand signal shifted by a second predetermined number of bit positions determined by the value of said second multiplier signal, said second partial product output being truncated to a number of bits which is less than 2N−1;
each of said shift matrices including logic means for evaluating the bits truncated from each of said partial product outputs as a function of the magnitude and sign of associated multiplier bits to provide first and second carry signal outputs suited for forming two's complement forms of said truncated partial products; and
a first adder having a first addend input coupled to said truncated one's complement partial product output of said first shift matrix, a second addend input coupled to said truncated one's complement partial product output of said second shift matrix, a carry input coupled to said first carry signal output so as to produce the two's complement of said first partial product and an output at which a weighted product signal is provided which when combined with said second carry signal output comprises a two's complement product signal; where N is greater than 2.

2. A multiplier circuit according to claim 1 wherein each said shift matrix is supplied with additional least significant bit fixed inputs and said logic means is supplied with said least significant bit fixed inputs, with least significant bits of said N-bit two's complement multiplicand signal and with said first signed multiplier signal for evaluating the values of bits truncated from said first partial product output so as to produce a first carry signal output suitable for converting said one's complement form of said truncated first partial product to two's complement form 3. A multiplier circuit according to claim 2 wherein said logic means is supplied with said least significant bit fixed inputs and with said second multiplier signal for evaluating the values of bits truncated from said second partial product output so as to produce a second carry signal output suitable for converting said one's complement form of said second partial product to two's complement form.

4. A multiplier circuit according to claim 3 wherein each said partial product is truncated to (2N−5) bits, each said signed multiplier signal is dimensioned to produce a maximum shift of (N−1) bit positions and the number of said least significant bits supplied to said logic means is 4.

5. A multiplier circuit according to claim 4 wherein each said shift matrix further comprises (2N−5) controlled inverter stages each having a first input responsive to the sign bit of an associated multiplier and a second input responsive to a single bit of said two's complement multiplicand signal shifted by a predetermined number of bit positions corresponding to the value of said associated multiplier.

6. A multiplier circuit according to claim 4 wherein each said multiplier signal comprises a four bit nibble consisting of a sign bit, a multiply by one-half bit, a multiply by one-quarter bit and a multiply by one-sixteenth bit, said first and second multiplier signals comprising in combination a coded weighting coefficient.

7. A multiplier circuit according to claim 6 wherein N=8 and each said four bit nibble has a maximum value of seven.

8. A multiplier circuit according to claim 1 wherein said digital filter comprises a plurality of sections and a full adder associated with each section of said filter, each said last-named adder having first and second addend inputs for receiving, respectively, a weighted product signal from one of said first adders and a two's complement form of a weighted time sequential sample and further having a carry input for receiving a second carry signal output associated with said weighted product signal and an output for providing, in two's complement form, the sum of addends supplied at said first and second inputs.

9. In a method of producing filtered output signals by combining weighted time sequential samples of a digital input data signal, a method or weighting signal samples comprising:
providing an N-bit, two's complement multiplicand signal which is to be weighted,
providing an N-bit multiplier signal for weighting said multiplicand signal,
encoding said N-bit multiplier signal into two N/2 bit signed multiplier nibbles in which each nibble represents one nonzero signed digit, the two nibbles being selected to approximate said multiplier signal,
shifting and truncating bits of said multiplicand signal in response to each of said nibbles to orders determined by the values of the bits of said nibbles to form first and second truncated partial products,
forming one's complements of each of said first and second truncated partial products according to the signs associated with respective nibbles.
forming first and second carry signals by evaluating the truncated bits and the multiplier signs and values,
adding the first of said carry signals to the one's complement of said first truncated partial product to form a two's complement of the first truncated partial product,
summing the two's complement of the first truncated partial product and the one's complement of the second truncated partial product, and
supplying the resulting sum and said second carry signal to a full adder for forming a two's complement sum.

10. In a digital filter for producing filtered output signals by combining weighted time sequential samples of a digital input data signal, a multiplier circuit comprising:

a first shift matrix having a data signal input for receiving an eight-bit two's complement multiplicand signal which is to be weighted, a control signal input for receiving a first signed multiplier signal, and a first partial product output for providing an eleven bit one's complement form of said eight bit two's complement multiplicand signal shifted by a first predetermined number of bit positins determined by the value of said first multiplier signal, said first partial product output being truncated to eleven bits;

a second shift matrix having a data signal input for receiving said eight-bit two's complement multiplicand signal which is to be weighted, a control signal input for receiving a second signed multiplier signal, and a second partial product output for providing an eleven bit one's complement form of said eight bit two's complement multiplicand signal shifted by a second predetermined number of bit positions determined by the value of said second multiplier signal, said second partial product output being truncated to eleven bits;

said first and second multiplier signals comprising respective bit nibbles, each nibble consisting of a sign bit, and a preselected number of fractional multiplied bits multiply by one-half bit, a multiply by one-quarter bit and a multiply by one-sixteenth bit, said first and second multiplier signals comprising, in combination, a coded version of an eight-bit weighting coefficient having a maximum of two non-zero signed digits, each said nibble corresponding to one of said signed digits and being dimensioned to produce a maximum shift of (x-1) bit positions of an applied multiplicand through its respective shift matrix;

each said shift matrix comprising banks of controllable paired switches for shifting the applied multiplicand signal by corresponding orders of two,;

each said shift matrix further comprising eleven one's complement stages each responsive to one bit of the partial product output of the associated shift matrix and to the sign bit of the associated multiplier nibble to provide a one's complement partial product output from the associated shift matrix;

each of said shift matrices including logic means for evaluating four bits truncated from each of said partial product outputs as a function of the magnitude and sign of associated multiplier bits so as to provide first and second carry signal outputs suited for converting each said one's complement partial product to two's complement form;

a first adder having a first addend input coupled to said truncated one's complement partial product output of said first shift matrix, a second addend input coupled to said truncated one's complement partial product output of said second shift matrix, a carry input coupled to said first carry signal output so as to produce the two's complement of said first partial product and output at which a weighted product signal is provided which, when combined with said second carry signal output comprises a two's complement full product signal; and a second adder associated with one order of said filter, and having first and second addend inputs for receiving, respectively, a weighted product signal from said first adder and a two's complement form of a weighted time sequential sample and further having a carry input for receiving said second carry signal output associated with said weighted product signal and an output for providing, in two's complement form, the sum of addends supplied at said first and second inputs.

* * * * *